(12) United States Patent
Hosseini et al.

(10) Patent No.: US 9,249,014 B2
(45) Date of Patent: Feb. 2, 2016

(54) PACKAGED NANO-STRUCTURED COMPONENT AND METHOD OF MAKING A PACKAGED NANO-STRUCTURED COMPONENT

(71) Applicant: Infineon Technologies AG, Neubiberg (DE)

(72) Inventors: Khalil Hosseini, Weihmichl (DE); Joachim Mahler, Regensburg (DE); Georg Meyer-Berg, Munich (DE)

(73) Assignee: Infineon Technologies Austria AG, Villach (AT)

( * ) Notice: Subject to any disclaimer, the term of this patent is extended or adjusted under 35 U.S.C. 154(b) by 105 days.

(21) Appl. No.: 13/670,390

(22) Filed: Nov. 6, 2012

(65) Prior Publication Data

US 2014/0126165 A1    May 8, 2014

(51) Int. Cl.
*H05K 1/00* (2006.01)
*B81C 3/00* (2006.01)
(Continued)

(52) U.S. Cl.
CPC ... *B81C 3/00* (2013.01); *C09J 7/00* (2013.01); *H01L 21/302* (2013.01); *H01L 21/306* (2013.01); *H01L 21/58* (2013.01); *H01L 23/3121* (2013.01); *H01L 23/49513* (2013.01); *H01L 24/03* (2013.01); *H01L 24/05* (2013.01); *H01L 24/29* (2013.01); *H01L 29/0657* (2013.01); *H01L 29/30* (2013.01); *B82Y 30/00* (2013.01); *C09J 2201/602* (2013.01);
(Continued)

(58) Field of Classification Search
CPC ............. H05K 1/11; H05K 1/16; H05K 1/18; H01L 21/52; H01L 21/60; H01L 21/70; H01L 21/768; H01L 23/00; H01L 23/02; H01L 23/34; H01L 23/36; H01L 23/48; H01L 23/49; H01L 23/538; H01L 31/02; H01L 31/0272; H01L 31/06; H01L 31/0216; H01L 33/00; H01L 33/22; H01L 33/06; H01L 33/04; H01L 33/60
USPC ................. 174/258, 260; 257/714, E21.589, 257/E21.705, E23.12, E23.056, 669; 228/246, 249, 252; 428/119; 438/117
See application file for complete search history.

(56) References Cited

U.S. PATENT DOCUMENTS 6,753,197 B2 *  6/2004  Dudoff et al. ................... 438/25
6,919,119 B2 *  7/2005  Kalkan et al. ................. 428/119
(Continued)

FOREIGN PATENT DOCUMENTS

CN    101419964 A    4/2009
CN    101449368 A    6/2009
(Continued)

OTHER PUBLICATIONS

Stubenrauch, M., et al., "Black Silicon as Functional Layer in Microelectronics," before Jul. 2012, 4 pages.
(Continued)

*Primary Examiner* — Xiaoliang Chen
(74) *Attorney, Agent, or Firm* — Slater & Matsil, L.L.P.

(57) ABSTRACT

An assembled component and a method for assembling a component are disclosed. In one embodiment the assembled component includes a component carrier, an attachment layer disposed on the component carrier and a component disposed on the attachment layer, the component having a nano-structured first main surface facing the component carrier.

15 Claims, 8 Drawing Sheets

(51) Int. Cl.

| | |
|---|---|
| *C09J 7/00* | (2006.01) |
| *H01L 21/306* | (2006.01) |
| *H01L 21/58* | (2006.01) |
| *H01L 29/30* | (2006.01) |
| *H01L 23/31* | (2006.01) |
| *H01L 21/302* | (2006.01) |
| *H01L 23/495* | (2006.01) |
| *H01L 29/06* | (2006.01) |
| *H01L 21/268* | (2006.01) |
| *H01L 23/00* | (2006.01) |
| *H01L 23/14* | (2006.01) |
| *B82Y 30/00* | (2011.01) |

(52) U.S. Cl.
CPC ............ *H01L21/268* (2013.01); *H01L 23/145* (2013.01); *H01L 23/147* (2013.01); *H01L 24/32* (2013.01); *H01L 24/83* (2013.01); *H01L 2224/03002* (2013.01); *H01L 2224/03009* (2013.01); *H01L 2224/03831* (2013.01); *H01L 2224/04026* (2013.01); *H01L 2224/04042* (2013.01); *H01L 2224/05076* (2013.01); *H01L 2224/05155* (2013.01); *H01L 2224/05166* (2013.01); *H01L 2224/05557* (2013.01); *H01L 2224/05568* (2013.01); *H01L 2224/05576* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L 2224/291* (2013.01); *H01L 2224/29005* (2013.01); *H01L 2224/2919* (2013.01); *H01L 2224/2929* (2013.01); *H01L 2224/29339* (2013.01); *H01L 2224/29344* (2013.01); *H01L 2224/29347* (2013.01); *H01L 2224/29439* (2013.01); *H01L 2224/32225* (2013.01); *H01L 2224/32245* (2013.01); *H01L 2224/48227* (2013.01); *H01L 2224/48247* (2013.01); *H01L 2224/73265* (2013.01); *H01L 2224/83192* (2013.01); *H01L 2224/83365* (2013.01); *H01L 2224/83801* (2013.01); *H01L 2224/83851* (2013.01); *H01L 2224/94* (2013.01); *H01L 2924/00014* (2013.01); *H01L 2924/07802* (2013.01); *H01L 2924/1301* (2013.01); *H01L 2924/1305* (2013.01); *H01L 2924/13055* (2013.01); *H01L 2924/13091* (2013.01); *H01L 2924/1461* (2013.01); *H01L 2924/15747* (2013.01); *H01L 2924/181* (2013.01); *Y10T 29/4913* (2015.01); *Y10T 29/49144* (2015.01); *Y10T 29/49146* (2015.01)

(56) References Cited

U.S. PATENT DOCUMENTS

| | | | | |
|---|---|---|---|---|
| 7,235,745 B2* | 6/2007 | Das et al. | ................. | 174/260 |
| 7,400,665 B2* | 7/2008 | Wang et al. | ............ | 372/50.124 |
| 7,629,678 B2* | 12/2009 | Floyd | ................. | 257/678 |
| 7,800,208 B2 | 9/2010 | Otremba | | |
| 7,831,151 B2* | 11/2010 | Trezza | ................. | 398/135 |
| 8,456,074 B2* | 6/2013 | Armitage et al. | ........ | 313/309 |
| 8,628,996 B2* | 1/2014 | Dimitrakopoulos et al. | ... | 438/71 |
| 2004/0137724 A1* | 7/2004 | Joshi et al. | ................. | 438/672 |
| 2005/0051607 A1* | 3/2005 | Wang et al. | ................. | 228/246 |
| 2005/0116336 A1* | 6/2005 | Chopra et al. | ............. | 257/720 |
| 2005/0136270 A1* | 6/2005 | Besnoin et al. | ............ | 428/469 |
| 2006/0113511 A1* | 6/2006 | Chen | .......................... | 252/500 |
| 2007/0114657 A1* | 5/2007 | Dangelo et al. | ........... | 257/720 |
| 2007/0145606 A1* | 6/2007 | Mahler et al. | .............. | 257/783 |
| 2008/0136035 A1* | 6/2008 | Aggarwal et al. | .......... | 257/762 |
| 2008/0176030 A1* | 7/2008 | Fonash et al. | .............. | 428/119 |
| 2008/0279750 A1* | 11/2008 | Chik | ....................... | 423/445 B |
| 2009/0071532 A1* | 3/2009 | Chan et al. | ................. | 136/252 |
| 2009/0072408 A1* | 3/2009 | Kabir et al. | ................. | 257/773 |
| 2009/0097022 A1* | 4/2009 | Shen et al. | ................. | 356/301 |
| 2009/0133914 A1* | 5/2009 | Dellmann et al. | ........... | 174/260 |
| 2009/0165844 A1* | 7/2009 | Dutta | ...................... | 136/255 |
| 2009/0181478 A1* | 7/2009 | Cox et al. | ................... | 438/22 |
| 2009/0215208 A1* | 8/2009 | Coe-Sullivan et al. | ........ | 438/22 |
| 2009/0215209 A1* | 8/2009 | Anc et al. | ................... | 438/22 |
| 2010/0038664 A1* | 2/2010 | Strauss | ........................ | 257/98 |
| 2010/0044678 A1* | 2/2010 | Afzali-Ardakani et al. | .... | 257/24 |
| 2010/0052189 A1* | 3/2010 | Sakurai et al. | .............. | 257/778 |
| 2010/0065868 A1* | 3/2010 | Kitagawa et al. | ............ | 257/98 |
| 2010/0209471 A1* | 8/2010 | Weber | ........................ | 424/423 |
| 2010/0264032 A1* | 10/2010 | Bazant | ....................... | 204/518 |
| 2010/0270673 A1* | 10/2010 | Oppermann | ................. | 257/739 |
| 2010/0319974 A1* | 12/2010 | Ishizuka | ..................... | 174/260 |
| 2011/0033156 A1* | 2/2011 | Sanghera et al. | ............ | 385/76 |
| 2011/0104817 A1* | 5/2011 | Kang et al. | ................. | 436/177 |
| 2011/0108971 A1* | 5/2011 | Ewe et al. | ................... | 257/686 |
| 2011/0135881 A1* | 6/2011 | Burkhardt | ................... | 428/172 |
| 2011/0156000 A1* | 6/2011 | Cheng | ......................... | 257/13 |
| 2011/0215355 A1* | 9/2011 | van de Ven et al. | ........... | 257/98 |
| 2011/0233483 A1* | 9/2011 | Breen et al. | ................. | 252/519.2 |
| 2011/0240953 A1* | 10/2011 | Ellinger et al. | ............. | 257/9 |
| 2011/0270221 A1* | 11/2011 | Ross | ........................... | 604/506 |
| 2011/0309382 A1* | 12/2011 | Lowgren | ...................... | 257/88 |
| 2012/0000525 A1* | 1/2012 | Flood | .......................... | 136/256 |
| 2012/0024365 A1* | 2/2012 | Branz et al. | ................. | 136/256 |
| 2012/0055013 A1* | 3/2012 | Finn | ............................ | 29/600 |
| 2012/0125537 A1* | 5/2012 | Kabir et al. | ................. | 156/306.9 |
| 2012/0171746 A1* | 7/2012 | Mazur et al. | ................ | 435/173.5 |
| 2012/0174658 A1* | 7/2012 | Gamel et al. | ................ | 73/64.56 |
| 2012/0291862 A1* | 11/2012 | Jiawook | ...................... | 136/255 |
| 2012/0301607 A1* | 11/2012 | Kabir et al. | ................. | 427/126.1 |
| 2013/0003179 A1* | 1/2013 | Vang et al. | ................. | 359/485.01 |
| 2013/0010446 A1* | 1/2013 | Henrik et al. | ............... | 361/783 |
| 2013/0026969 A1* | 1/2013 | Kim et al. | ................... | 320/103 |
| 2013/0051032 A1* | 2/2013 | Jones et al. | ................. | 362/335 |
| 2013/0153277 A1* | 6/2013 | Menard et al. | .............. | 174/260 |
| 2013/0187122 A1* | 7/2013 | Lee et al. | .................... | 257/9 |
| 2014/0004304 A1* | 1/2014 | Yu et al. | .................... | 428/144 |
| 2014/0017900 A1* | 1/2014 | Doba et al. | ................. | 438/710 |
| 2014/0030847 A1* | 1/2014 | Kotlanka et al. | ............. | 438/107 |

FOREIGN PATENT DOCUMENTS

| | | |
|---|---|---|
| CN | 101734611 A | 6/2010 |
| WO | 2009035393 A1 | 3/2009 |
| WO | 2011110596 A2 | 9/2011 |

OTHER PUBLICATIONS

Hoffmann, S., et al., "Axial p-n Junctions Realized in Silicon Nanowires by Ion Implantation," Nano Letters, Mar. 3, 2009, 1341-1344, vol. 9, No. 4.

* cited by examiner

PACKAGED NANO-STRUCTURED COMPONENT AND METHOD OF MAKING A PACKAGED NANO-STRUCTURED COMPONENT

TECHNICAL FIELD

The present invention relates generally to packaged electrical components and in particular to a specific type of silicon die-to-carrier attachment.

BACKGROUND

Packaging constitutes the last phase of single or multiple chip device fabrication and provides the necessary interconnects between chip and chip carrier. Packaging further provides an enclosure protecting against environmental influences such as chemical corrosion and damage due to thermal and mechanical impact or irradiation.

Thermo-mechanical stress induced defects have become a reliability issue impacting the lifetime of electronic devices. Delamination at the contact interface between chip and chip carrier and crack formation at or in the vicinity of the interface have been identified as contributor to the problem. A cause for the appearance of such defects is the application of high temperature or high pressure processes during device manufacturing including assembly and packaging.

SUMMARY OF THE INVENTION

In accordance with an embodiment of the invention an assembled component comprises a component carrier, an attachment layer disposed on the component carrier and a component disposed on the attachment layer, the component having a nano-structured first main surface facing the component carrier.

In accordance with an embodiment of the invention a method for making an assembled component comprises forming an attachment layer on a component carrier and placing a first main surface of a component onto the attachment layer, the first main surface of the component comprising a nano-structure.

In accordance with an embodiment of the invention a method of manufacturing a component comprises covering a front side of a silicon wafer with a protective layer, nano-structuring a backside of the silicon wafer, removing the protective layer from the front side of the silicon wafer and separating the silicon wafer into individual dies.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a packaged silicon die comprising a nano-structured silicon surface (termed "black silicon"). However, embodiments of the invention may also be applied to nano-structured surfaces of semiconductive components.

A packaged component comprises a die attachment layer forming a mechanical and/or electrical die/carrier contact. A problem with the conventional contact is that the die/carrier contact may require a certain minimum thickness for the attachment layer to mitigate thermo-mechanical stress. Moreover the die/carrier junction may provide an undesirable high ohmic contact resistance for conductive adhesive layers when the layer is too thick.

In one embodiment the present invention provides a nano-structure on a surface of a component. The nano-structure may comprise black silicon. Black silicon is a surface modification of silicon forming nanostructures with a low reflectivity. For example, black silicon may comprise a reflectivity of about ≤5% vs. 20% to 30% for standard mono-crystalline silicon. Accordingly, a black silicon surface is dark to the naked eye or when viewed under the microscope. A black silicon surface may comprise up to 1 to 2 million needle or cone like nanostructures per $mm^2$.

Figure 1A:
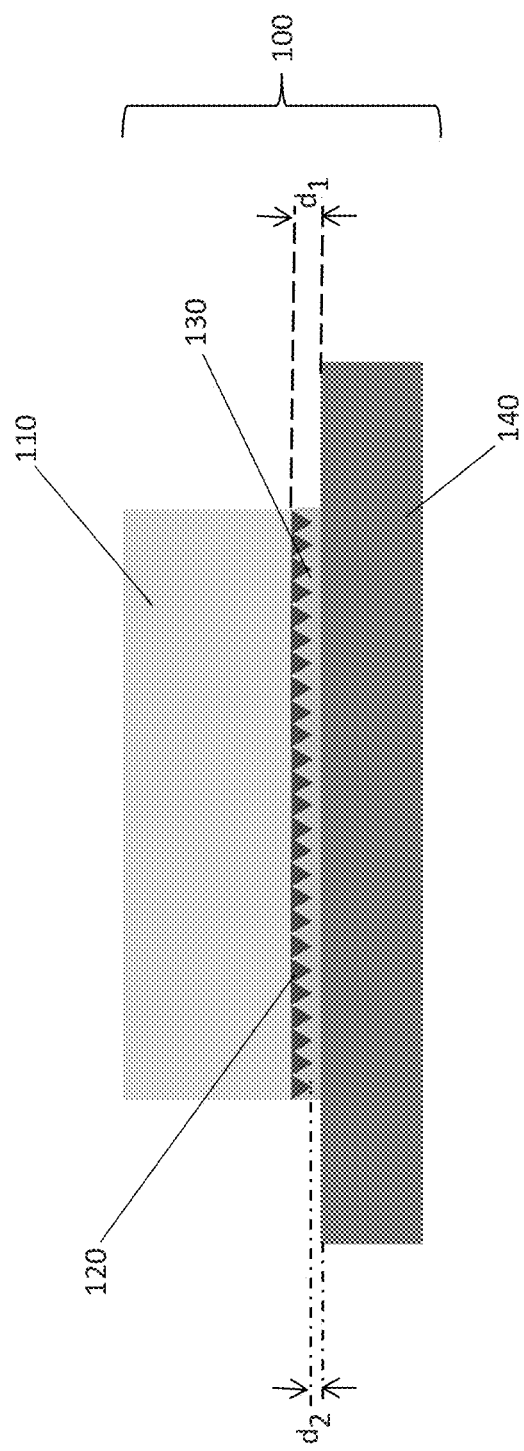
FIG. 1a illustrates a cross-sectional view of an embodiment of an assembled component comprising a non-conductive adhesive attachment layer.

FIG. 1a illustrates a cross-sectional view of an embodiment of an assembled component 100. The assembled component 100 comprises a component 110, a component carrier 140, and an attachment layer 130 disposed between the component 110 and the component carrier 140.

The attachment layer 130 may comprise an electrically non-conductive adhesive layer. For example, the non-conductive adhesive layer 130 may comprise an adhesive tape or an adhesive paste. The non-conductive adhesive layer 130 may be in direct physical contact with the first main surface of the component 110.

The component 110 (also referred to as die or chip) comprises a substrate. The substrate may be a semiconductor substrate such as silicon or germanium, or a compound substrate such as SiGe, GaAs, InP, GaN or SiC. The substrate may be doped or undoped and may comprise one or more wells. The semiconductor substrate may be a single crystal silicon or a silicon-on insulator (SOI).

The component 110 may comprise a discrete device such as a single semiconductor device or an integrated circuit (IC). For example, the component 110 may comprise a semiconductor device such as a MOSFET or a diode. Alternatively, the component 110 may be a resistor, a protective device, a capacitor, a sensor such as a MEMS or a detector, for example. The component 110 may be a system on chip (SoC).

The component carrier 140 may comprise a silicon substrate, a metallic leadframe, or a prepreg laminate comprising alternating layers of metal (e.g., Cu) and glass impregnated with epoxy resins (e.g., a printed circuit board). The component carrier 140 may comprise electrically conductive and/or non-conductive elements.

The non-conductive adhesive layer 130 may comprise epoxy, epoxy/urethane, polyester or polyimide resins mixed with an organic cross-linker component. The thickness of the non-conductive adhesive layer 130 is in the range of about 20 µm to about 30 µm. In one embodiment the non-conductive adhesive layer 130 may comprise glass fibers or similar materials to provide improved mechanical stability.

A first main surface 120 of the component 110 is attached to the non-conductive adhesive layer 130 and the component carrier 140. The first main surface or the backside 120 of the component 110 may comprise a nano-structured surface. The nano-structured surface 120 may be black silicon (or a black silicon layer).

The thickness of the nano-structured backside surface 120 of the component 110 may be about 5 µm to about 20 µm. Alternatively, the nano-structured backside surface 120 may be about 0.2 µm to about 50 µm.

The non-conductive adhesive layer 130 provides a strong chemical bond to the component 110 and the component carrier 140. The non-conductive adhesive layer 130 may be a compliant element or the least rigid element of the assembled component 100. Therefore, the non-conductive adhesive layer 130 may provide a stress buffer zone to mitigate thermo-mechanical stress created at the component/component carrier juncture. Thermo-mechanical stress may be caused by differences in the coefficients of thermal expansion (CTE) of the materials involved in joint formation. For example, the CTE of silicon is 2.5 ppm/K while the CTE of a Cu leadframe is 16.5 mm/K.

With conventional die-carrier connections a gradual transition of material properties at the interface occurs within a transition region of a few atomic monolayers. In embodiments of the present invention the transition region may be extended to the full thickness of the nano-structured surface 120. Such an extended transition region of a nano-structured interface 120 has the advantage that stress mitigation may occur more efficiently. The minimum distance between component surface 120 and carrier surface, $d_2$, may be significantly reduced as compared to the conventional case in absence of nano-structured surface 120. Accordingly, the minimum thickness of the applied non-conductive adhesive layer 130 may be relaxed. For example, the non-conductive adhesive layer 130 may be about 5 µm to about 10 µm.

Moreover, the nano-structured surface 120 enlarges the effective interface area between the non-conductive adhesive layer 130 and the component 110. Accordingly, heat dissipation from the electronic component 110 to the component carrier 140 is improved during operation. Finally, the increased surface 120 increases the mechanical strength of the component 110/component carrier 140 joint.

Figure 1B:
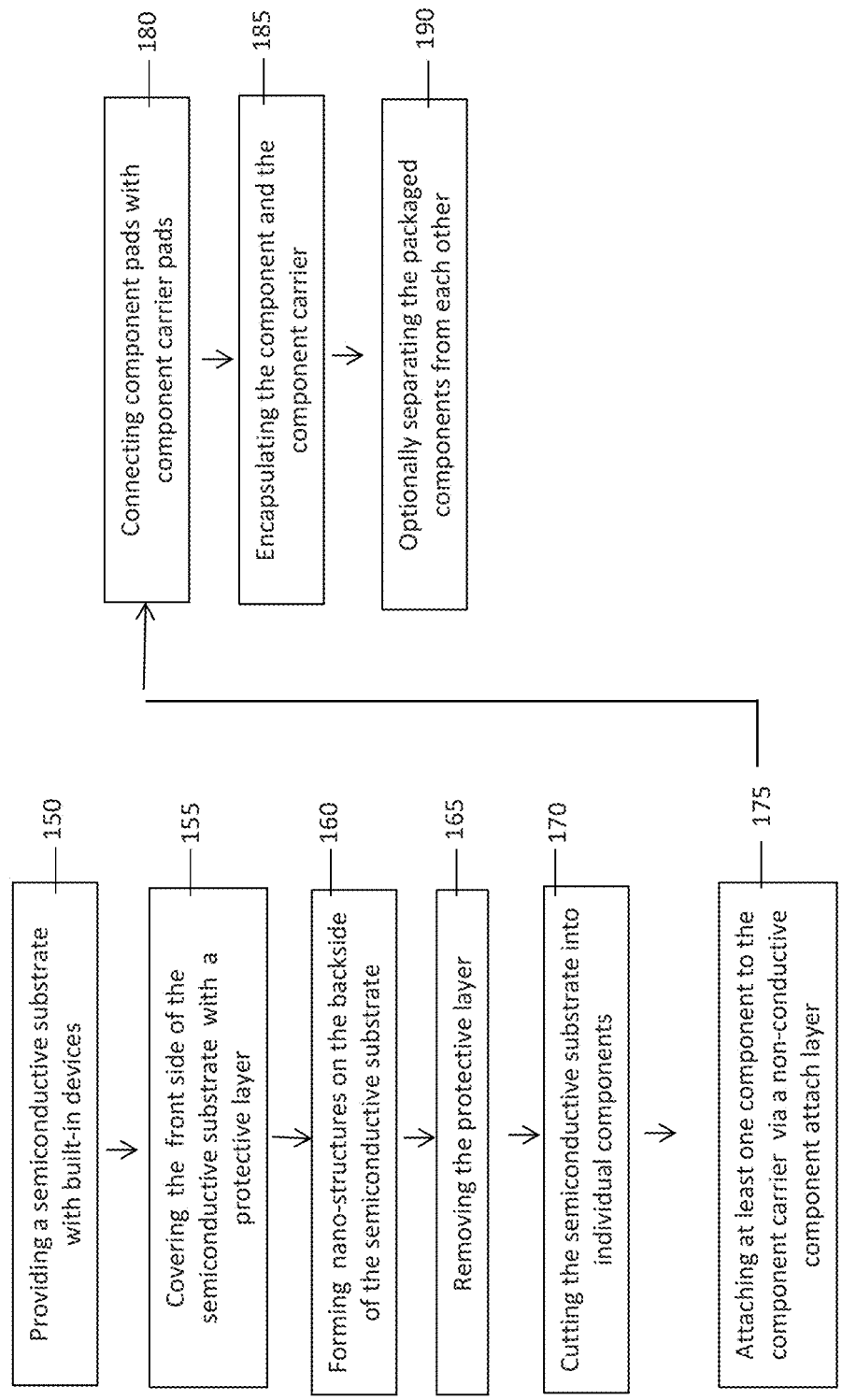
FIG. 1b shows an embodiment of a method for manufacturing a packaged component comprising a non-conductive adhesive attachment layer.

FIG. 1b shows a flow chart of an embodiment of a method to manufacture a packaged component comprising a non-conductive adhesive layer.

In step 150 a semiconductive substrate (e.g., a wafer) comprising a plurality of electrical components is provided. The semiconductive substrate may have or may have not been thinned on its backside to reduce the height of the substrate and eventually the packaged component.

In step 155 the front side of the semiconductive substrate is covered with a protection layer. The protection layer is configured to protect the front side of the semiconductive substrate against nano-structuring of the semiconductive substrate. The protection layer may be spin coated or spray coated on semiconductive substrate. The protection layer may comprise an organic polymer film. Alternatively, the protective layer is a dummy wafer glued to the semiconductive substrate. In one embodiment, the protection layer may cover the sidewalls of the semiconductive substrate if nano-structures are formed by a wet etch technique.

In step 160 nano-structures are formed on the back-side of the semiconductive substrate. In one embodiment a dry etch process may be used to create a nano-structured surface of the semiconductive substrate. For example, the dry etch process may comprise simultaneous or alternating etching and random self-masking of the semiconductive substrate. The self-masking may comprise passivating the etched surface by passivation layer deposits. The dry etch methods may produce needle or cone like nanostructures. The semiconductive needles or cones may be 0.5 µm to 25 µm long and exhibit diameters of 50 nm to 200 µm. The formation of the semiconductive nano-structure may be self-limiting as of a certain etch depth.

The nano-structures may be formed by a capacitively coupled plasma (CCP) or a inductively coupled plasma (ICP) etch techniques in a low pressure regime (e.g., 10 mT to 100 mT).

In one embodiment the semiconductive substrate may be etched with a reactive ion etch (RIE) process. For example, the RIE etch process and the random non-continuous passivation of the silicon surface occurs simultaneously. $SF_6$ or $CF_4$, in combination with $O_2$, may be used to form black silicon. Random silicon surface passivation may be supported by the addition of hydrocarbon species (e.g., $CH_4$) or fluorohydrocarbon species (e.g., Octafluorocyclobutane $C_4F_8$) to the etch gas. Such additions may lead to the deposition of polymerized organic and complex $SiO_xC_yF_z$ compounds on the silicon surface. Low forward power (e.g., as low as only a few W) may help to create black silicon.

Exemplary process conditions are: ICP power: 800 W to 2000 W, pressure: 10 mT to 50 mT, $SF_6$ flow: 20 sccm to 30 sccm, $SF_6/O_2$: ratio~3:1, optionally low $CH_4$ addition (≤5 sccm), and forward power 3 W to 20 W.

In one embodiment a black silicon surface is formed by a "Bosch-type" dry etch process. With this type of etch process very short (e.g., 4 s to 5 s long) steps of silicon etching and passivation layer formation are carried out in alternating sequences. $SF_6$ is used for silicon etching while $C_4F_8$ is used in the passivation steps. $C_4F_8$ forms Teflon-like depositions on the silicon surface.

Exemplary processing conditions are: ICP power: 1000 W to 2000 W, pressure: 10 mT to 25 mT, $SF_6$ or alternatively $C_4F_8$ flow: 100 sccm to 200 sccm, He flow: 5 sccm to 10 sccm, Si etch/passivation deposition times 3 s to 10 s. Creation of a nano-structured silicon surface of 25 µm depth may require 5 to 50 etch/deposit steps. Short duty cycles may produce smoother sidewalls of the silicon nanostructures, longer cycles may furnish an improved etch rate.

In one embodiment a black silicon surface is formed with a cryogenic silicon etch process: In this case a $SF_6/O_2$ gas mixture may be employed at very low temperatures, e.g., in the range of negative 100° C. to negative 130° C. In this temperature range isotropic chemical etching of silicon is slowed down and sidewall passivation may be maintained by a very thin (only 10 nm to 20 nm thick) $SiO_xF_y$ layer.

In one embodiment the nano-structured silicon surfaces may be formed by a wet etch techniques. The application of wet etch chemistries may produce nanostructures with smoother sidewalls than those created by dry etch techniques. The wet etching technique may comprise applying an aqueous $HF/AgNO_3$ solution for 4 min to 5 min which may produce 200 nm to 300 nm deep nano-pores with diameters of 50 nm to 100 nm. This process may be modified to obtain varying depths of silicon nano-structures. Alternatively, a solution comprising nano-sized Ag particles with an average diameter of 3 nm to 4 nm may be dispensed over a Si(100) surface, followed by soaking in an aqueous HF solution and hydrogen peroxide ($H_2O_2$), or of ammonium fluoride with hydrogen peroxide (e.g., 1.0 M $NH_4F$+5.0 M $H_2O_2$). A catalyzed silicon etching may occur underneath the dispensed Ag particles.

In one embodiment micro/nanostructures on Si (100) surfaces may be formed by ultrafast laser irradiation (e.g., usage of Nd:YAG lasers) or by an e-beam irradiation followed by thermal annealing.

In step 165 the protection layer on the semiconductive substrate is removed. For example, the protection layer may be removed with an organic solvent or with another suitable medium.

In step 170 the semiconductive substrate comprising the nano-structure on the backside is separated into individual components using dicing equipment. For example, the semiconductive substrate may be cut by a saw or by a laser.

In step 175 one or more components are placed on a component carrier. In one embodiment an adhesive foil is placed on the component carrier. For example, a first adhesive foil is picked up by a pick & place robot and accurately disposed at a defined position on the component carrier. The component carrier may be an individual unit such as a PCB board or a sheet comprising a plurality of leadframe structures. The adhesive foil may be a piece of 100% solid adhesive film cut or laser-cut from a sheet or a stripe of adhesive foil. Alternatively the adhesive foil may be a prefabricated piece of adhesive film (preform) available in a wide variety of shapes and sizes. The adhesive foil may be placed under vacuum to avoid the inclusion of air bubbles.

A first singulated component is picked up and placed over the first adhesive foil. The first singulated component is attached to the component carrier. The latter may be kept at a temperature sufficiently high to soften the adhesive foil and to make it more compliant. The attachment may occur at temperatures of 150° C. to 160° C. for adhesive films comprising polyester compounds or at 120° C. to 200° C. for films comprising epoxy resins, for example. The pressure may be in the range of 1 PSI to 5 PSI.

In one embodiment an adhesive paste is placed on the component carrier. The adhesive paste may be applied by a paste dispense system to predefined regions of the component carrier's top surface. The adhesive paste materials may comprise epoxy, acrylate, cyanate ester or polyimide compounds. The adhesive paste materials may further comprise a cross-linking compound and a solvent.

The adhesive layer is then dried. Solvent and water are carefully removed from the adhesive layer to ensure absence of voids and good bond-line thickness uniformity, for example. Paste drying may occur in an oven or by flow of hot air.

In one embodiment a plurality of components are placed on the component carrier. The steps for placing a component on the component carrier may be repeated.

In step 180 component pads are connected to the component carrier pads. For example, wires or conductive clips are bonded to the component pad and the component carrier pads. Bonding techniques may be wire bonding or ball bonding.

At step 185 the attached component(s) and the component carrier are encapsulated. For example, the component is completely or partially encapsulated and the component carrier is partially encapsulated. The encapsulation material may comprise a molding compound, a laminate or a global top coating. In one embodiment the encapsulated component carrier is separated into individual packaged components. For example, the encapsulated component carrier may be cut by a saw or by a laser. This is shown in step 190.

Figure 2A:
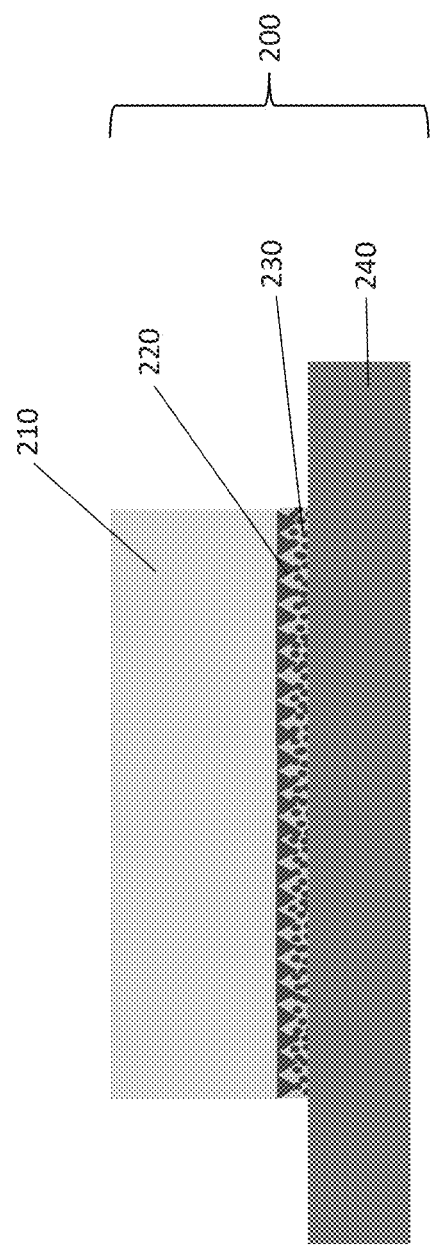
FIG. 2a illustrates a cross-sectional view of an embodiment of an assembled component comprising a conductive adhesive attachment layer.

A further embodiment of an assembled component 200 is shown in FIG. 2a. The assembled component comprises a component 210 with a nano-structured backside 220, a component carrier 240, and an electrically conductive adhesive layer 230 disposed between the component 210 and the component carrier 240.

The assembled component 200 may comprise the same or similar elements, materials and dimensions as described with respect to the embodiments of FIG. 1a except for the differences described below.

The component 210 may be a power semiconductor device such as a bipolar transistor, an insulated gate bipolar transistor (IGBT), a power MOSFET, a thyristor, or a vertical device. Alternatively, the component 210 may be a passive component such as a diode.

The conductive adhesive layer 230 may comprise a conductive adhesive paste or a conductive adhesive foil. The conductive adhesive layer 230 may comprise an organic base polymer such as an epoxy, an acrylate, an epoxy/polyurethane or a polyimide resin, and further additions. The conductive adhesive layer 230 may further comprise a metal content of more than 60%, or alternatively, a metal content of 60% to 95% weight percent. The conductive adhesive layer 230 may comprise highly conductive flakes of Ag, Au, Ag-coated Cu, or Au-coated Ni. The thickness of the conductive adhesive layer 230 may vary between 5 µm and 30 µm. Alternatively, the thickness ranges between 20 µm and 30 µm.

Optionally, the component 210 may comprise a metallization layer on the backside. The metallization layer may be disposed (e.g., a metal layer or a metal layer stack) on top of the nano-structured semiconductive surface 220 prior to the attachment of the component 210 to the component carrier 240 covered with the conductive adhesive film 230. The metallization layer may be less than 1 µm thick. In one embodiment the metallization layer may comprise Au, Au—Ni, Au—Sn, NiV—Ag, Ag or Cu—Sn—Ag.

The assembled component 200 provides improved adhesion strength and reduced stress at the component 210/component carrier 240 joint. The stress profile is improved because of the presence of the nano-structured semiconductive surface 220 as buffer layer against mechanical stress. The nano-structured semiconductive surface may allow a reduced thickness of the conductive adhesive layer 230. Accordingly, the electric resistance of the component 210/component carrier 240 joint may be reduced. Typical values of the electrical resistance are in the range of about $10^{-3}$ to about $10^{-6}$ Ωcm.

Moreover, a significantly enlarged semiconductive surface 220 area in combination with the thermal conductivity of the metal-filled adhesive layer 230 may result in an improved heat dissipation during device operation.

In one embodiment the component 210/component carrier 240 joint is disposed above a heat sink and the heat sink is disposed in the component carrier 240. The thermal conductivity of an Ag-filled adhesive material may be 50 to 500 times higher than the thermal conductivity of metal-free polymers.

Figure 2B:
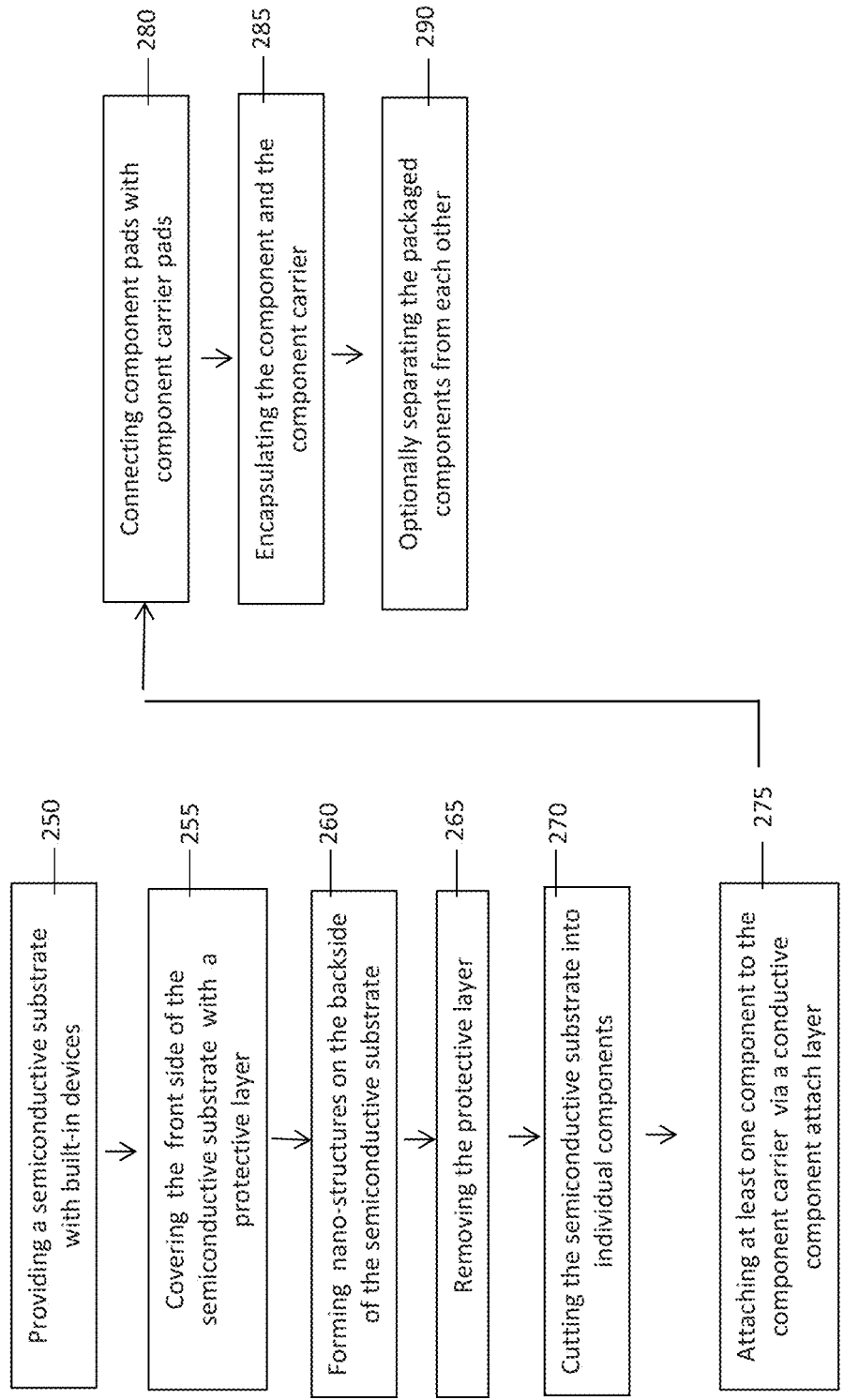
FIG. 2b shows an embodiment of a method for manufacturing a packaged component comprising a conductive adhesive attachment layer.

FIG. 2b shows a flow chart of an embodiment of a method to manufacture a packaged component. The process steps 250 to 270 are identical to the previously discussed steps 150 to 170 of the flow chart of FIG. 1b.

In step 275 at least one component is attached to a single component carrier or a component carrier assembly such as a leadframe sheet. A conductive attachment layer is disposed on the component carrier. The conductive attachment layer may be a conductive paste or a conductive foil.

The conductive paste may be applied by a paste dispense system to predefined regions of the component carrier's top surface. The conductive paste materials may comprise epoxy, acrylate, cyanate ester or polyimide compounds. The conductive paste layer may further contain metallic particles of similar loading and similar chemical nature as already described with regard to the conductive adhesive foil. The conductive adhesive materials may further comprise a cross-linking compound and a solvent.

The conductive adhesive layer is then dried. Solvent and water are carefully removed from the conductive adhesive layer to ensure absence of voids and good bond-line thickness uniformity, for example. Paste drying may occur in an oven or by flow of hot air.

Then the first component is picked up using pack & place equipment and accurately placed and aligned over a predefined pre-heated component carrier region covered with conductive paste. The component is then pressed under controlled pressure into the softened paste material to achieve die attachment. Subsequently the first attached component is released from the pick-up head. This step may be repeated until all components are placed on the component carrier. Finally, the conductive paste layer is cured (preferably in an oven) to drive cross-linking between polymer chains to full completion and strengthen the chemical or physical bonding at the interfaces of the component/component carrier joint. An operation temperature to avoid chemical decomposition of the applied paste material may be about 200° C. for epoxy based pastes and about 280° C. for cyanate ester based pastes.

Alternatively, the components are mounted on the component carrier via a conductive foil. The components are placed on the conductive foil and then mounted to the component carrier similar to the method described in the embodiment of FIG. 1b.

In step 280 component pads are connected to the component carrier pads. For example, wires or conductive clips are bonded to the component pad and the component carrier pads. Bonding techniques may be wire bonding or ball bonding.

At step 285 the attached component(s) and the component carrier are encapsulated. For example, the component is completely or partially encapsulated and the component carrier is partially encapsulated. The encapsulation material may comprise a molding compound, a laminate or a glob top coating. In one embodiment the encapsulated component carrier is separated into individual packaged components. For example, the encapsulated component carrier may be cut by a saw or by a laser. This is shown in step 290.

Figure 3A:
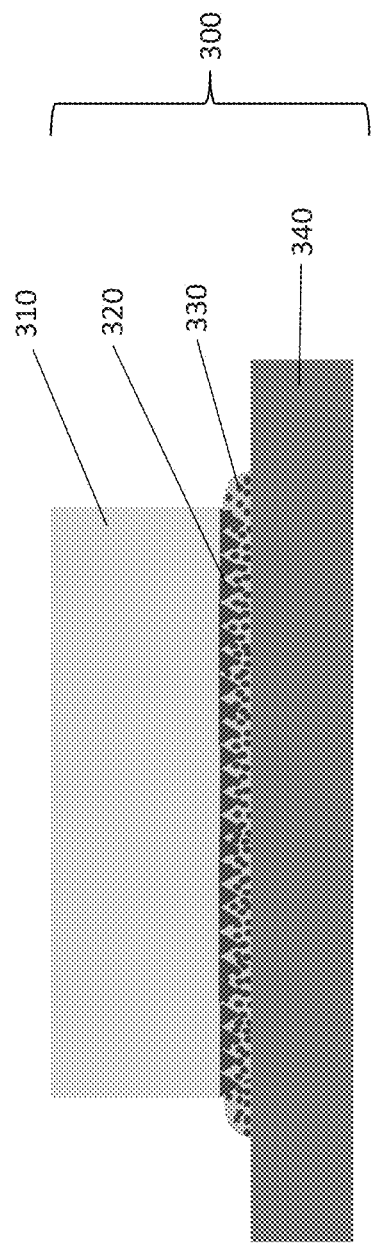
FIG. 3a illustrates a cross-sectional view of an embodiment of an assembled component comprising a soldered attachment layer.

FIG. 3a shows a further embodiment of an assembled component 300. The assembled component 300 comprises a component 310 including a nano-structured backside surface 320, a component carrier 340, and an attachment layer 330. The attachment layer 330 comprises one or more layers of metal or metal alloys. The attachment layer (stack) 330 is disposed between the nano-structured semiconductive surface 320 and the component carrier 340.

In one embodiment the attachment layer (stack) 330 may comprise 50 nm to 200 nm titanium (Ti), 100 nm to 500 nm Ni, and 50 nm to 500 nm Ag or Au, wherein the Ag or Au layer is the last deposited layer. Alternatively Ni/Au or Ni/Ag bilayers may be employed.

In case the thickness of the metallic attachment layer (stack) 330 extends beyond the tops of the needle or cone-like nano-structures of the semiconductive surface 320 by more than 1 μm to 2 μm, the metallization layer (stack) 330 may be used to form a component pad at the bottom of the semiconductive component 310. Such component pads may be directly solder-attached to corresponding circuitry of a component carrier such as a printed circuit board (PCB).

In conventional packaging approaches, by comparison, the component may be attached to a central portion (die paddle) of a metallic leadframe from where interconnects may lead to a PCB. Direct conductive attachment of the component 310 to the PCB may be more cost effective by reducing material costs and the number of required solder steps.

In one embodiment the nano-structured semiconductive surface 320 covered by a metallic layer (stack) 330 is configured to be a "heat spreader" layer. For example, an overlying heat sink may be disposed on the nano-structured semiconductive (e.g., silicon)/metal bilayer at the front side of the component.

Figure 3B:
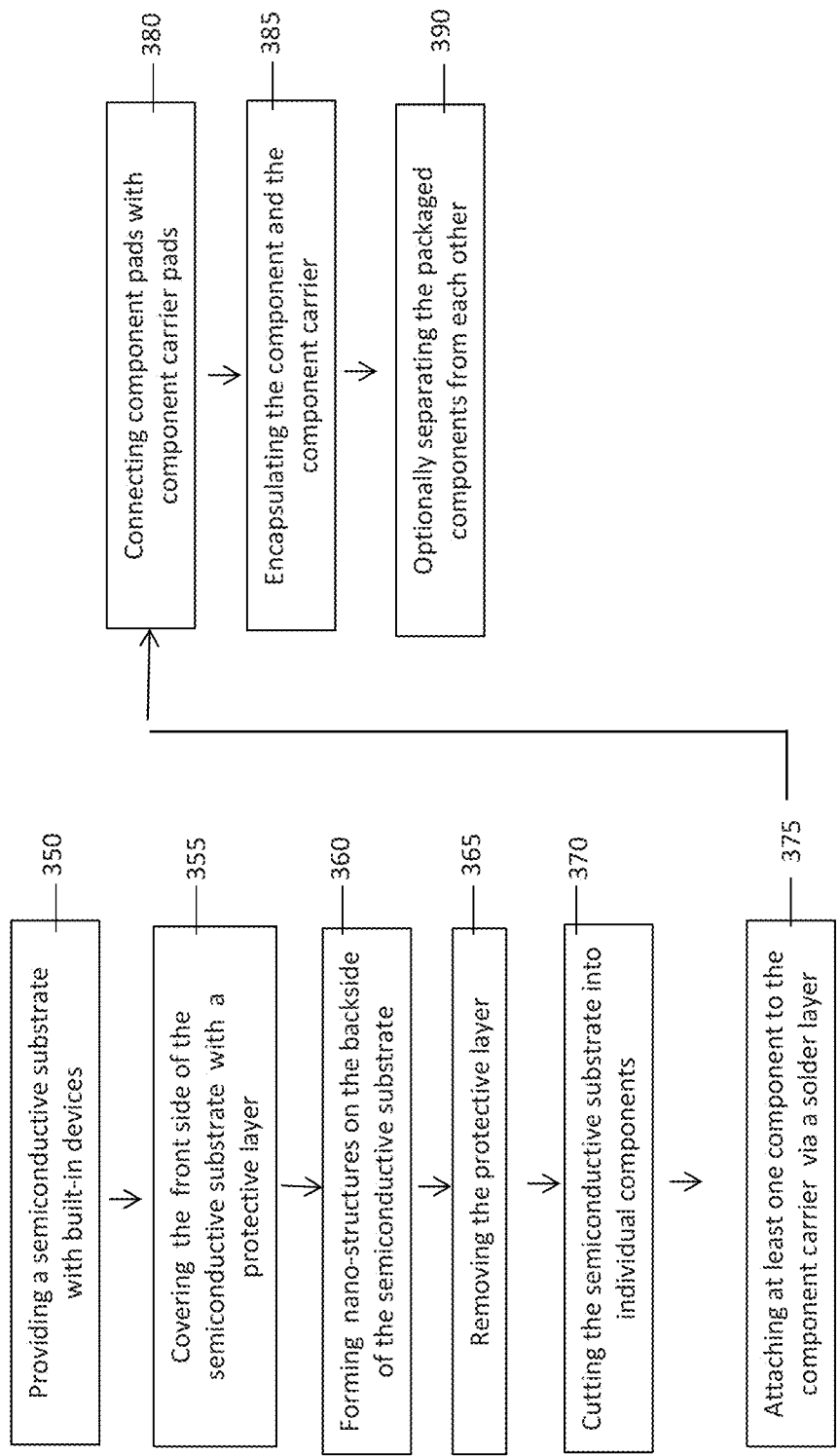
FIG. 3b shows an embodiment of a method for manufacturing a packaged component comprising a soldered attachment layer.

FIG. 3b shows a flow chart of an embodiment of a method to manufacture a packaged component comprising a soldered nano-structured surface. The process steps 350 to 370 are identical to the previously discussed steps 150 to 170 of the flow chart of the embodiment in FIG. 1b.

In step 375 at least one component is attached to a single component carrier or a component carrier assembly such as a leadframe sheet. A solder material or metallic ink is deposited over defined regions of the component carrier's top surface. In one embodiment, the solder material may comprise AuSn, AgSn, CuSn or AgIn. Alternatively, the solder material may comprise Pb or Zn-based solder materials. Metallic inks may comprise metal particles being a few tens of nm in size made from Ag, Cu or Ag coated Cu or Ni material called core-shell materials.

Subsequently a first component is s picked up with pick & place equipment and placed over a defined portion of the component carrier. Then the first component is bonded to the component carrier. The first component may be diffusion soldered in the presence of solder materials at a temperature range of 300° C. to 400° C. Alternatively, the first component is diffusion soldered at ≤200° C. or ≤350° C.

In one embodiment the component and the component carrier may be sintered together with an intermittent metallic ink layer at temperatures between 220° C. and 250° C. within 1 min to 2 mins while applying pressure in the range of 1 MPa to 5 MPa.

Subsequently the first attached component is released from the pick-up head and the next component may be attached to the component carrier.

In step 380 component pads are connected to the component carrier pads. For example, wires or conductive clips are bonded to the component pad and the component carrier pads. Bonding techniques may be wire bonding or ball bonding.

At step 385 the attached component(s) and the component carrier are encapsulated. For example, the component is completely or partially encapsulated and the component carrier is partially encapsulated. The encapsulation material may comprise a molding compound, a laminate or a glob top coating. In one embodiment the encapsulated component carrier is separated into individual packaged components. For example, the encapsulated component carrier may be cut by a saw or by a laser. This is shown in step 390.

Figure 4:
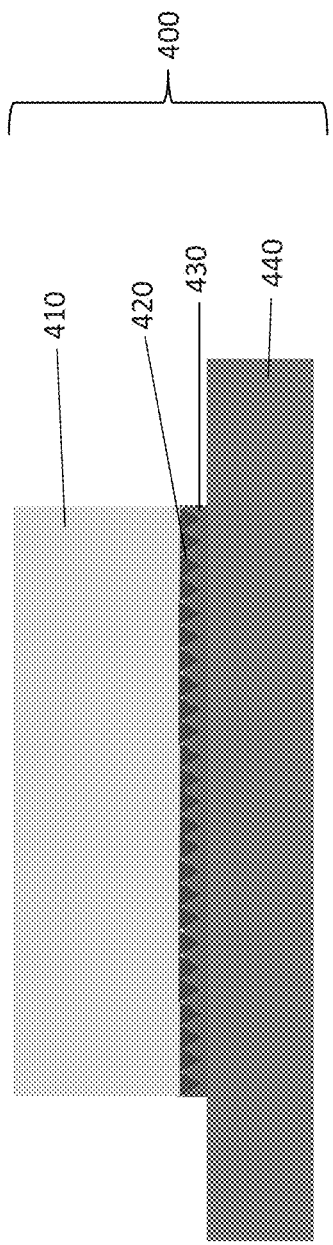
FIG. 4 shows a cross-sectional view of an embodiment of an assembled component comprising a doped nano-structured surface.
Figure 5:
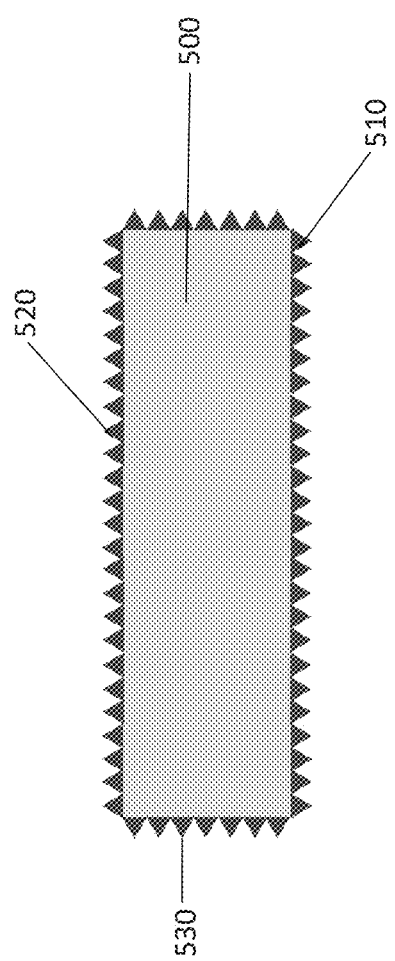
FIG. 5 shows a cross-sectional view of an embodiment of a component having more than one nano-structured surface.

FIG. 4 shows a cross-sectional view of an embodiment of an assembled component 400. The assembled component 400 comprises a component 410 having a highly doped nano-structured backside surface 420. The component 410 overlies a component carrier 440. A solder material layer 430 is deposed between the component 410 and the component carrier 440. In one embodiment, the nano-structured semiconductive surface 420 (e.g., black silicon) may be implanted with Sb in the range of $5\times10^{16}$ atoms/cm$^2$ to $5\times10^{19}$ dopant atoms/cm$^2$ or with P in the range of $5\times10^{17}$ dopant atoms/cm$^2$ to $5\times10^{20}$ dopant atoms/cm$^2$. Such high dopant concentrations in the nano-structured semiconductive surface 420 may significantly decrease the electrical resistivity of the component 410/component carrier 440 junction. In one embodiment a vertical device 410 may be built with a doped nano-structured semiconductive surface 420 but without a backside metallization. Alternatively, the vertical device 410 may comprise a doped nano-structured semiconductive surface 420 and a backside metallization.

In one embodiment a packaged component with a highly doped nano-structured surface may be manufactured according to the embodiment of FIG. 3b. In an additional process step the nano-structured semiconductive surface (black silicon) is doped. The nano-structured semiconductive surface 420 may be doped before or after the nano-structured surface 420 is formed. Dopant levels may be in the range of $10^{16}$/cm$^2$ to $10^{20}$/cm$^2$. Usable dopants may be P, Sb or B.

Figure shows a cross sectional view of an embodiment of a component 500. The component 500 is a semiconductive component. In one embodiment the component comprises silicon or a compound semiconductor. The component 500 comprises a plurality of nano-structured surfaces. For example, all surfaces or two surfaces are nano-structured. Alternatively, other numbers of surfaces are nano-structured.

In one embodiment the bottom main surface 510 may be attached to a component carrier. For example, the bottom main surface 510 is covered with a metallization layer (stack) and disposed on a heat sink (which is disposed in the component carrier). The top main surface 520 and the sidewalls 530 of the component 500 are encapsulated. The nano-structured sidewall surfaces 530 and the top surface 520 provide improved adhesion to encapsulating material, e.g., a molding material.

Manufacturing a component with a complete nano-structured periphery may be carried out with a wet etch technique (e.g., etching the component with an aqueous solution comprising HF and AgNO$_3$). If only selected surfaces of the component should have nano-structured surfaces, the non-selected surfaces are covered with a mask before applying the etch chemistries, for example.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An assembled chip comprising:
   a chip carrier;
   an insulating attachment layer disposed on the chip carrier; and
   an individual chip disposed on the insulating attachment layer, the chip having a nano-structured first main surface facing the chip carrier, wherein the nano-structured first main surface comprises black silicon, wherein nano-structures of the nano-structured first main surface comprise a length, wherein the insulating attachment layer comprise a thickness, and wherein the length is less than the thickness.

2. The assembled chip according to claim 1, wherein the nano-structured first main surface comprises a high concentration of dopants.

3. The assembled chip according to claim 1, wherein the chip further comprises a nano-structured second main surface opposite the nano-structured first main surface.

4. The assembled chip according to claim 1, wherein the thickness is between about 10 μm and about 50 μm.

5. The assembled chip according to claim 1, wherein the thickness is between about 5 μm and about 10 μm.

6. The assembled chip according to claim 1, wherein the nano-structured first main surface comprises a needle or cone comprising nano-structured main surface.

7. The assembled chip according to claim 1, wherein the insulating attachment layer is an insulating adhesive tape or an insulating adhesive paste.

8. The assembled chip according to claim 1, wherein the chip comprises an integrated circuit chip.

9. The assembled chip according to claim 1, wherein the chip comprises a MEMS chip.

10. The assembled chip according to claim 1, wherein the chip comprises a MOSFET chip.

11. The assembled chip according to claim 1, wherein the chip carrier is a leadframe.

12. The assembled chip according to claim 1, wherein the chip carrier is a printed circuit board.

13. The assembled chip according to claim 1, wherein the chip carrier is a silicon substrate.

14. The assembled chip according to claim 1, further comprising an encapsulation material, wherein the encapsulation material encapsulates the chip, and wherein the encapsulation material is a molding compound.

15. The assembled chip according to claim 3, wherein the chip further comprises nano-structured third and fourth main surfaces connecting the nano-structured first main surface with the nano-structured second main surface.

* * * * *

UNITED STATES PATENT AND TRADEMARK OFFICE
CERTIFICATE OF CORRECTION

PATENT NO. : 9,249,014 B2
APPLICATION NO. : 13/670390
DATED : February 2, 2016
INVENTOR(S) : Khalil Hosseini Page 1 of 1

It is certified that error appears in the above-identified patent and that said Letters Patent is hereby corrected as shown below:

On the Title Page, Item (71) Applicant, lines 1-2, delete "Infineon Technologies AG, Neubiberg (DE)" and insert --Infineon Technologies Austria AG, Villach, AUSTRIA--.

Signed and Sealed this
Seventeenth Day of May, 2016

Michelle K. Lee
*Director of the United States Patent and Trademark Office*